United States Patent
Jin et al.

(10) Patent No.: US 10,418,432 B2
(45) Date of Patent: Sep. 17, 2019

(54) DISPLAY PANEL, METHOD FOR MAKING DISPLAY PANEL, AND ELECTRONEC DEVICE

(71) Applicant: Shanghai Tianma AM-OLED Co., Ltd., Shanghai (CN)

(72) Inventors: Jian Jin, Shanghai (CN); Congyi Su, Shanghai (CN)

(73) Assignee: SHANGHAI TIANMA AM-OLED CO., LTD., Shanghai (CN)

(*) Notice: Subject to any disclaimer, the term of this patent is extended or adjusted under 35 U.S.C. 154(b) by 0 days.

(21) Appl. No.: 15/796,674

(22) Filed: Oct. 27, 2017

(65) Prior Publication Data
US 2018/0342568 A1 Nov. 29, 2018

(30) Foreign Application Priority Data
May 26, 2017 (CN) .......................... 2017 1 0385916

(51) Int. Cl.
*H01L 27/32* (2006.01)
*H01L 51/50* (2006.01)
(Continued)

(52) U.S. Cl.
CPC ...... *H01L 27/3262* (2013.01); *H01L 27/3248* (2013.01); *H01L 27/3258* (2013.01);
(Continued)

(58) Field of Classification Search
CPC ............. H01L 27/3248; H01L 27/3258; H01L 37/3262; H01L 51/0097; H01L 51/5008;
(Continued)

(56) References Cited

U.S. PATENT DOCUMENTS 6,520,643 B1* 2/2003 Holman ............. G03B 21/2073
349/9
8,879,766 B1* 11/2014 Zhang ................... H04R 1/028
381/333

(Continued)

FOREIGN PATENT DOCUMENTS

CN      101477421 A      7/2009
CN      103748538 A      4/2014
(Continued)

OTHER PUBLICATIONS

CN Office Action dated Apr. 23, 2019 for corresponding CN Application No. 2017103859167.

*Primary Examiner* — Prabodh M Dharia
(74) *Attorney, Agent, or Firm* — Tarolli, Sundheim, Covell & Tummino LLP

(57) ABSTRACT

A display panel includes an array substrate including a base substrate and a drive unit; a light-emitting functional layer placed on one side of the drive unit and electrically connected with the drive unit; a sealing film layer placed on one side of the light-emitting functional layer; and a polarization functional layer placed on a light output side of the display panel. The polarization functional layer includes a coated polarization layer. Compared with the prior art, the display panel includes less film layers, and layers of the display panel are thinner, which facilitates the thin-type design. In addition, the method for making a display panel is simple, a production cost is low, and a production efficiency is high, which is good for a large-scale production application.

14 Claims, 9 Drawing Sheets

(51) Int. Cl.
  *H01L 51/52* (2006.01)
  *H01L 51/56* (2006.01)
  *H01L 51/00* (2006.01)

(52) U.S. Cl.
  CPC ...... *H01L 51/0097* (2013.01); *H01L 51/5008* (2013.01); *H01L 51/5016* (2013.01); *H01L 51/5215* (2013.01); *H01L 51/5253* (2013.01); *H01L 51/5296* (2013.01); *H01L 51/56* (2013.01)

(58) Field of Classification Search
  CPC ............ H01L 51/5016; H01L 51/5215; H01L 51/5253; H01L 51/5296; H01L 51/56
  USPC ...................... 345/46, 102; 349/12; 381/333
  See application file for complete search history.

(56) References Cited

U.S. PATENT DOCUMENTS

| | | | | |
|---|---|---|---|---|
| 2007/0052660 | A1* | 3/2007 | Montbach | G02B 26/005 345/102 |
| 2013/0032830 | A1* | 2/2013 | Lee | G02B 5/3041 257/88 |
| 2016/0054607 | A1* | 2/2016 | Ishizaki | G02F 1/13338 349/12 |
| 2016/0212839 | A1* | 7/2016 | Choi | H01L 51/5253 |
| 2016/0252766 | A1* | 9/2016 | Liu | G02F 1/1333 345/173 |
| 2016/0322394 | A1* | 11/2016 | An | H01L 27/1218 |
| 2016/0349892 | A1* | 12/2016 | Wang | G06F 3/0412 |
| 2017/0031217 | A1* | 2/2017 | Jung | G02F 1/1345 |
| 2017/0247579 | A1* | 8/2017 | Kwak | B32B 27/08 |
| 2017/0309867 | A1* | 10/2017 | Mun | C09J 133/066 |
| 2018/0095211 | A1* | 4/2018 | Lee | G02B 5/3041 |
| 2018/0101359 | A1* | 4/2018 | Harada | G06F 7/5443 |
| 2018/0130972 | A1* | 5/2018 | Sonoda | H01L 27/3276 |
| 2018/0204886 | A1* | 7/2018 | Lee | H01L 27/323 |

FOREIGN PATENT DOCUMENTS

| | | |
|---|---|---|
| CN | 103885238 A | 6/2014 |
| CN | 104112764 A | 10/2014 |
| CN | 104659051 A | 5/2015 |
| CN | 105807359 A | 7/2016 |
| CN | 106648257 A | 5/2017 |

* cited by examiner

DISPLAY PANEL, METHOD FOR MAKING DISPLAY PANEL, AND ELECTRONEC DEVICE

CROSS-REFERENCE TO RELATED APPLICATIONS

The present application claims the benefit of priority to Chinese Patent Application No. 201710385916.7, filed on May 26, 2017, the content of which is incorporated herein by reference in its entirety.

TECHNICAL FIELD

The present disclosure relates to the technical field of display technologies and, more particularly, to a display panel, a method for making the display panel, and an electronic device.

BACKGROUND

With people's requirements on portable display terminal and development of display technology, in-depth researches on flexible display screen (also known as soft screen) is also gradually developed. Different from a conventional flat-panel displayer, if a flexible material is used as a substrate in an organic light-emitting device, the organic light-emitting device can realize a flexible display, so that a dreamy visual effect can be obtained. Because of its flexibility, a flexible organic light-emitting device can be applied in various fields, such as a curved display device, a flexible wearable device, a foldable displayer and the like.

At present, an organic light-emitting diode technology and an electro-phoretic display (Electro-phoretic, EPD) technology are main technologies for a market-oriented flexible display screen. Since there are various technical problems in EPD, such as slow response and poor full color, currently, an EPD product in the market is limited only to static eBooks. Due to advantages of self-illumination, fast response, large view angle, high resolution, high brightness, strong anti-bending property, low energy consumption and the like, OLED becomes a current mainstream of the flexible display product. In addition, micro light-emitting diode (micro LED) display technology and quantum light-emitting diode (QLED) technology are also gradually shown up prominently, and are expected to become strong rivals of the OLED display panel.

If a flexible panel will realize a highly flexible application, such as curved and foldable, first, a thickness of the display panel should decrease as much as possible. If the thickness of the display panel is too large, it will be bad for flexible bending property, and will cause a higher cost, moreover, when flexible panel is bent, the phenomenon of light-leakage may occur. Therefore, how to make a thin type flexible panel is a key issue urgently to be solved in the industry.

SUMMARY

In view of the above, the present disclosure provides a display panel, an electronic device including the display panel, and a method for making the display panel.

A first aspect of the present disclosure provides a display panel, including: an array substrate including a base substrate and a drive unit placed on the base substrate; a light-emitting functional layer placed on one side of the drive unit away from the base substrate and electrically connected with the drive unit; a sealing film layer placed on one side of the light-emitting functional layer away from the array substrate; and a polarization functional layer placed on a light output side of the display panel; wherein the polarization functional layer includes a coated polarization layer.

A second aspect of the present disclosure provides an electronic device including a display panel, and the display panel includes: an array substrate including a base substrate and a drive unit placed on the base substrate; a light-emitting functional layer placed on one side of the drive unit away from the base substrate and electrically connected with the drive unit; a sealing film layer placed on one side of the light-emitting functional layer away from the array substrate; and a polarization functional layer placed on a light output side of the display panel; wherein the polarization functional layer includes a coated polarization layer.

A third aspect of the present disclosure provides a method for making a display panel, including steps of: providing an array substrate, the array substrate including a base substrate and a drive unit placed on the base substrate; forming a light-emitting functional layer, the light-emitting functional layer being placed on one side of the drive unit away from the base substrate, the light-emitting functional layer being electrically connected with the drive unit; forming a sealing film layer, the sealing film layer being placed on one side of the light-emitting functional layer away from the array substrate; forming a polarization functional layer, the polarization functional layer including a coated polarization layer; and adhering the polarization functional layer on a light output side of the display panel.

The display panel of embodiments of the present disclosure includes an array substrate including a base substrate and a drive unit placed on the base substrate; a light-emitting functional layer placed on one side of the drive unit away from the base substrate and electrically connected with the drive unit; a sealing film layer placed on one side of the light-emitting functional layer away from the array substrate; and a polarization functional layer placed on a light output side of the display panel; wherein the polarization functional layer includes a coated polarization layer. Compared with the prior art, the display panel of the present disclosure includes less film layers, and layers of the display panel are thinner, which facilitates the thin type of the flexible display panel, greatly improves a bending property of the display panel, and prevents the display panel from the light leakage when being flexibly bended. In addition, the method for making display panel of the present disclosure is simple, a production cost is low, and production efficiency is high, which is good for a large-scale production application.

DESCRIPTION OF EMBODIMENTS

Figure 1:
FIG. 1 illustrates a structural schematic diagram of a display device in the prior art.

In order to better understand the purpose, features, and advantages of the present disclosure, the present disclosure is described in details as below with reference to the accompanying drawings.

It should be noted that, details are described as follows to fully understand the present disclosure. However, the present disclosure can be implemented with a variety of manners different from those described herein. Those skilled in the art can do similar popularization in the case of without departing from the essence of the present disclosure. Therefore, the present disclosure is not limited by following disclosed embodiments. In addition, among following description, identical reference signs represent same or similar structure in the drawings, thus repetition thereof will be omitted.

It should be appreciated for those skilled in that art that, when an element or a layer is described as "being placed on another element or layer", "being connected to another element or layer" or "being coupled to another element or layer", it can be directly placed on another element or layer, be directly connected to or be directly coupled to another element or layer, or there may be an element or a layer provided therebetween. On the contrary, when an element is referred to as "being directly placed on another element or layer", "being directly connected to another element or layer" or "being directly coupled to another element or layer", then an element or a layer is not provided therebetween.

It should be appreciated for those skilled in the art that, although term of first or second can be used for describing each element, part, region, layer, portion and/or section herein, but these elements, part, region, layer, portion and/or section should not be limited by these terms. These terms are only used for distinguishing an element, part, region, layer or section from another element, part, region, layer or section. Therefore, without departing from the teachings of the present disclosure, the first element, part, region, layer or section discussed below can be described as the second element, part, region, layer or section.

For ease of description, spatially related terms can be used herein, such as "under . . . ", "below . . . ", "lower portion", "top", "top portion", to describe relations between an element or feature and another element or feature shown in accompanying drawings. It should be understood that, spatially related terms are intended to include different positions of a device in use or in operation, in addition to a position described in accompanying drawing. For example, if the device in accompanying drawings is overturned, the element described as "below another element or feature" or "under another element or feature" will then be oriented to "above another element or feature". Thus, term "below . . . " includes upward direction and downward direction. Device can be oriented in other manners (rotated 90 degree or in other orientations), so as to correspondingly explain spatially related description language used herein.

Terms used herein are only intended to describe specific embodiments, and shall not be interpreted as limiting the present disclosure. As used herein, the "one" and "the" of singular form are also intended to including plural form, unless the context clearly indicates otherwise. It is further appreciated that, when being used in the present specification, term "include" represents that there exist a described feature, entirety, step, operation, element and/or part, but does not excluded the presence of or additional one or more other feature, entirety, step, operation, element, part and/or combinations thereof.

Unless otherwise defined, all terms (including technical and scientific terminology) used herein are identical with the implication that those skilled in the art are generally understood. Also it is further appreciated that, those terms defined in such as common dictionary should be interpreted as having the consistent implication of implication in field associated therewith, and thus unless clearly defined herein, they shall not be idealized or excessively explained during interpretation.

For the readers to better understand the technical solutions and advantages of the present disclosure, the prior art is firstly described simply as follows. Please refer to FIGS. 1 and 2, FIG. 1 illustrates a structural schematic diagram of a display device in the prior art, FIG. 2 illustrates a structural schematic diagram of a polarization functional layer in the prior art.

A display panel 100 includes an array substrate 01, a light-emitting functional layer 02, a sealing film layer 03, a barrier film layer 04, a polarization functional layer 05, and a touch functional layer 06. The array substrate 01 is used for driving the light-emitting functional layer 02 to emit light. The sealing film layer 03 is used for sealing the light-emitting functional layer 02, so as to play functions of planarization and protection for a luminescent device, and to prevent external moisture and oxygen from entering the interior of the light-emitting functional layer 02. The barrier film layer 04 is adhered on the sealing film layer 03 by an optically clear adhesive (Optically Clear Adhesive, OCA) for further preventing external moisture and oxygen. The polarization functional layer 05 is adhered on the barrier film layer 04 by OCA, for eliminating influences of ambient light from the exterior on display effect. In addition, the flexible display panel in the prior art further includes a touch functional layer 06. The touch functional layer 06 is adhered to the polarization functional layer 05, and then a flexible display and a touch function can be achieved at the same time.

The display panel in the prior art includes the barrier film layer with a relatively large thickness, for further blocking water and oxygen, so as to overcome a deficiency of the sealing functional layer in blocking water and oxygen. However, a thickness of the display panel is increased, which is bad for a thin-type design of the flexible panel. In addition, because of a high cost of the barrier film layer, a production cost of the flexible panel becomes high. Furthermore, in the above-described prior art, the barrier film layer 04 is adhered to the sealing film layer 03 by OCA, while OCA has a certain water-absorbing capacity, which is bad for the ability of water and oxygen proof of the flexible panel, and a lifetime of the flexible panel is greatly threatened.

Figure 2:
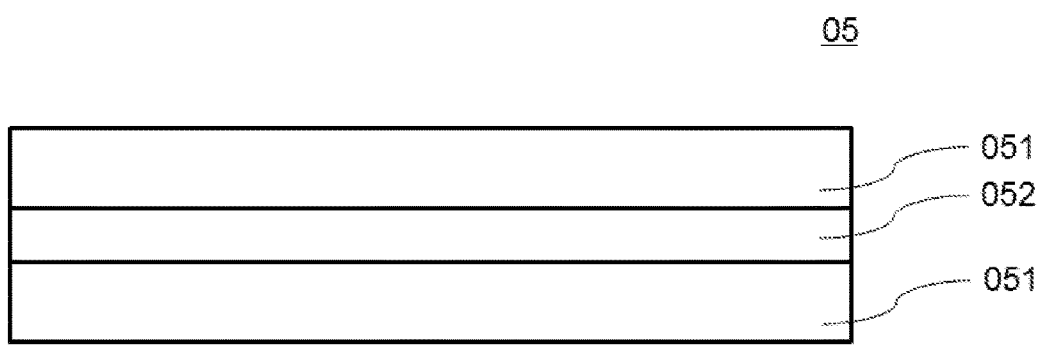
FIG. 2 illustrates a structural schematic diagram of a polarization functional layer in the prior art.

In addition, a structure of a polarization functional layer in the prior art is as shown in FIG. 2. The polarization functional layer 05 is a sandwich structure in which the polarization film 052 is sandwiched between two support bases 051. A material of the two support bases 051 is a triacetate cellulose (Triacetate Cellulose, TAC) material, and a thickness of each support base 051 is 40 μm, for playing functions of supporting and protecting the polarization film 052 placed in the middle. The polarization film 052 placed in the middle is made of polyvinyl alcohol (Polyvinyl Alcohol, PVA), and its thickness is about 20 μm. It is demonstrated that a thickness of the polarization functional layer 05 in the prior art is in a range of 120 μm-200 μm. If the polarization functional layer 05 with such a thickness is adhered to be applied in the flexible display panel, a flexibility of the display panel is greatly limited, and a large stress is generated, which is seriously bad for a highly flexible application of the flexible panel. Furthermore, when the polarization functional layer 05 with a large thickness is deformed under action of an external force, a phenomenon of light leakage easily happens, which greatly affects display quality of the display panel.

In order to overcome problems in the above-mentioned prior art, the present disclosure provides a display panel, an electronic device including the display panel, and a method for making the display panel. The display panel includes an array substrate including a base substrate and a drive unit placed on the base substrate; a light-emitting functional layer placed on one side of the drive unit away from the base substrate and electrically connected with the drive unit; a sealing film layer placed on one side of the light-emitting functional layer away from the array substrate; and a polarization functional layer placed on a light output side of the display panel; wherein the polarization functional layer includes a coated polarization layer. Compared with the prior art, the display panel of the present disclosure includes less film layers, and layers of the display panel are thinner, which facilitates the thin-type design of the flexible display panel, greatly improves a bending performance of the display panel, and prevents the display panel from light leakage when being flexibly bended. In addition, the method for making a display panel of the present disclosure is simple, the production cost is low, and the production efficiency is high, which is good for a large-scale production application.

Next, embodiments of the disclosure will be described in further detail with reference to the accompanying drawings, so that technical solution and protection content are more easily understood for readers.

Figure 3:
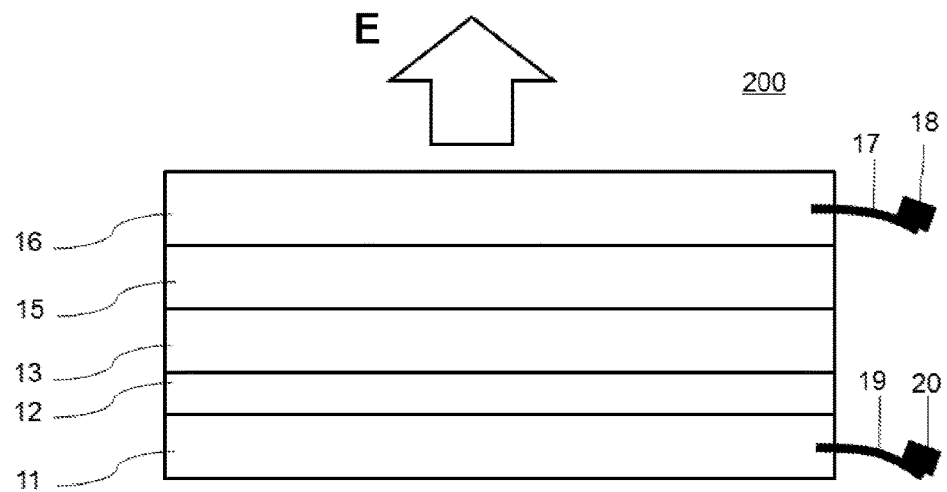
FIG. 3 illustrates a structural schematic diagram of a display device according to an embodiment of the present disclosure.
Figure 4:
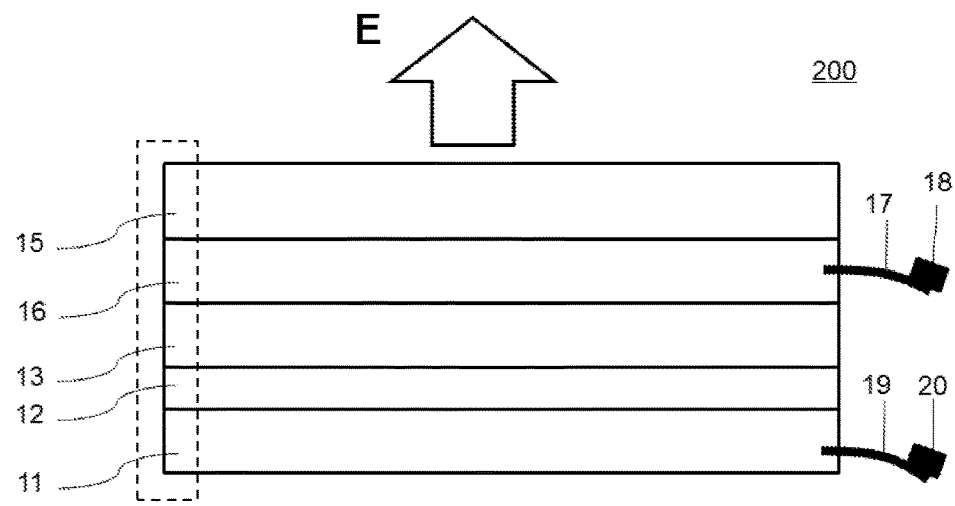
FIG. 4 illustrates a structural schematic diagram of another display device according to an embodiment of the present disclosure.

Please refer to FIGS. 3 and 4, which are structural schematic diagrams of two kinds of display device according to embodiments of the present disclosure. The display panel 200 includes an array substrate 11, including a base substrate and a drive unit placed on the base substrate; a light-emitting functional layer 12 electrically connected with the drive unit and placed on one side of the drive unit away from the base substrate; a sealing film layer 13 placed on one side of the light-emitting functional layer 12 away from the array substrate 11; and a polarization functional layer 15 placed on a light output side E of the display panel.

The polarization functional layer includes a coated polarization layer. Compared with the prior art, the display panel of the present disclosure includes less film layers without a use of a barrier film layer, and layers of the display panel are thinner, and thus cost becomes low. The display panel of embodiments of the present disclosure has a thinner thickness, which facilitates the thin-type design of the flexible display panel, greatly improves a bending property of the display panel, and prevents the display panel from the light leakage when being flexibly bended.

It should be noted that the light-emitting functional layer of the embodiments of the present disclosure can be a single way or various combinations of a micro light-emitting diode (micro LED, or called μLED), an organic light-emitting diode (OLED) layer, and a quantum light-emitting diode (QLED), which is not limited in the present disclosure. When the light-emitting functional layer is the micro LED, the sealing film layer can be a planarization layer, and is used for playing functions of planarization and protection for a display diode layer and buffering an external impact force and a pollution of external impurities. When the light-emitting functional layer is the OLED, the sealing film layer can be a thin film sealing layer of an OLED panel, and is used for sealing an OLED layer and blocking water and oxygen. When the light-emitting functional layer is OLED, the sealing film layer can be a protection film layer. Those are not limited in the present disclosure. The light-emitting functional layer of the present disclosure can be other kinds of functional layers capable of realizing flexible display, but not limited to those above-described. Moreover, the sealing film layer of the present disclosure is not necessary, which can be designed or chosen according to specific application. In some flexible display applications, the sealing film layer is not included, depending on an actual situation.

It should be understood for those skilled in the art, the polarization functional layer of the present disclosure is placed on the light output side of the display panel, which is not limited in the present disclosure. The display panel can be a top emission structure, a bottom emission structure, or a double-side display. For a display panel in the top emission structure, the polarization functional layer is placed on one side of the light-emitting functional layer away from the array substrate; for a display panel in the bottom emission structure, the polarization functional layer is placed on one side of the array substrate away from the light-emitting functional layer; and for a display panel in the double-side display structure, there may be one or more polarization functional layer, which can be placed on a same side of the display panel or on different sides respectively. In addition, in the double-side display structure, the polarization functional layer can be omitted, and details depend on an actual situation.

It should be further noted that, each embodiment described as follows in the present disclosure takes a flexible OLED panel in the top emission structure as an example. Any other device structure and any making method which belong to a same inventive concept with the present disclosure belong to the protection scope of the present disclosure, no matter they belong to any light output structure and which type of flexible display panels, as long as their structures belong within the protection thought of technical solution of the present disclosure.

Figure 7:
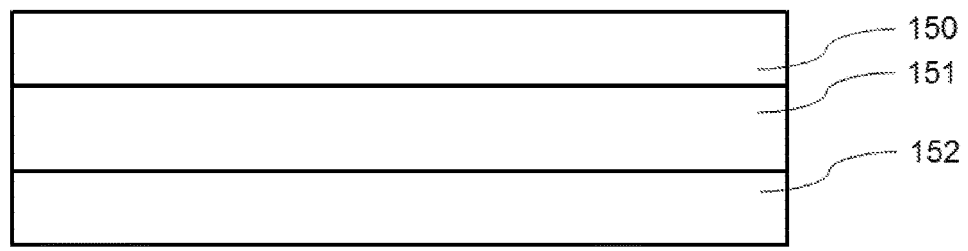
FIG. 7 illustrates a structural schematic diagram of a polarization functional layer of a display device according to an embodiment of the present disclosure.
Figure 8:
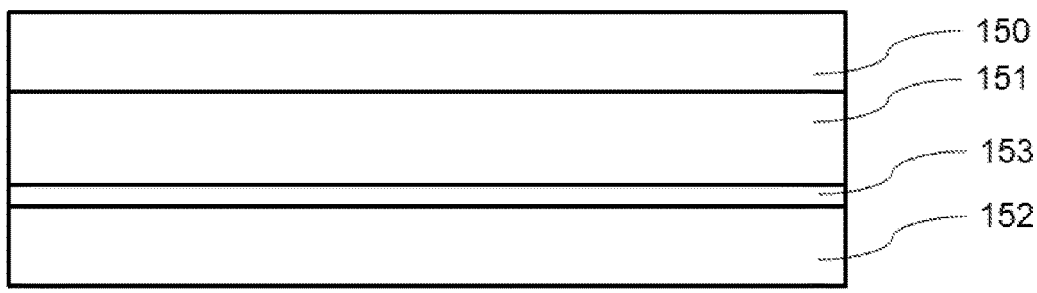
FIG. 8 illustrates a structural schematic diagram of another polarization functional layer of a display device according to an embodiment of the present disclosure.
Figure 9:
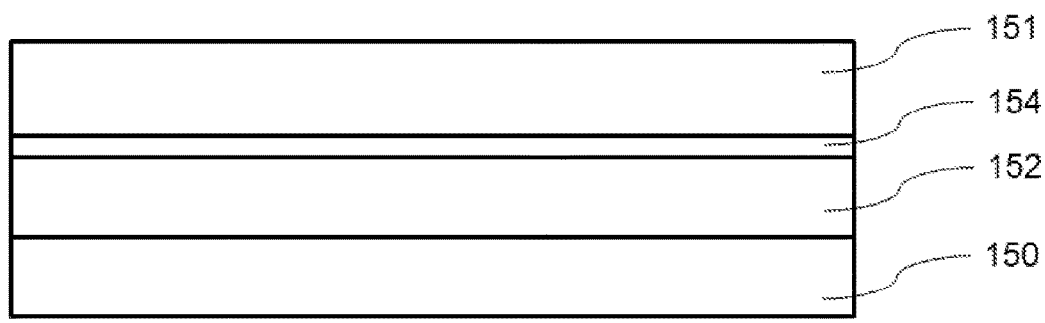
FIG. 9 illustrates a structural schematic diagram of still another polarization functional layer of a display device according to an embodiment of the present disclosure.

Next, further refer to FIGS. 3 and 4, and accompanying with FIGS. 7-9, the polarization functional layer of the present disclosure is described in details. For the display panel in the top emission type, the polarization functional layer 15 is placed on one side of the sealing film layer 13 away from the array substrate 11. The polarization functional layer 15 further includes a first base 150, and a coated polarization layer is formed on the first base 150. A configuration of the polarization functional layer in OLED or other panels is to prevent the influence of the reflection of external ambient light on display effect. In some implementing manners of the present disclosure, the coated polarization layer includes a linear polarization layer 151 and a phase delay layer 152, the principle is, when the external light is incident to the polarization functional layer, the external light is linearly polarized by the linear polarization layer 151, and is left circularly polarized at the phase delay layer 152; after the external light reaches to the display panel through the linear polarization layer 151 and the phase delay layer 152, the external light is reflected at film layer of the display panel, then light reflected is vertically linearly polarized at the phase delay layer 152, and a light polarization axis at this moment is absorbed since it is unable to penetrate the linear polarization layer 151. Thus, even the external light is incident to the display panel 200, a reflection light caused by reflection is prevented from reaching to users.

It should be noted that, the coated polarization layer of the present disclosure can be a film layer formed by coating liquid crystal and curing after orientation. The coated polarization layer can be made of other materials, which are not limited in the present disclosure. When the coated polarization layer includes the linear polarization layer 151 and the phase delay layer 152, both the linear polarization layer 151 and the phase delay layer 152 can be layers formed by coating liquid crystal material. A position relation between the coated polarization layer and the first base 150 can be as shown in FIGS. 7 and 8, and the linear polarization layer 151 and the phase delay layer 152 are placed on one side of the first base 150 facing the array substrate 11. In addition, the position relation between the coated polarization layer and the first base 150 can be as shown in FIG. 9, and the linear polarization layer 151 and the phase delay layer 152 are placed on one side of the first base 150 away from the array substrate 11. No matter in which placement, the phase delay layer 152 is placed on one side of the linear polarization layer 151 adjacent to the light-emitting functional layer 12, to guarantee that a cooperation of the linear polarization layer 151 and the phase delay layer 152 can effectively block reflection of the external ambient light.

When put into practice, as shown in FIG. 7, the first base 150, the linear polarization layer 151, and the phase delay layer 152 can be successively stacked and close to each other. In other implementing manners of the present disclosure, since both the linear polarization layer 151 and the phase delay layer 152 are liquid crystal layers formed by coating, it can be as shown in FIG. 8 that a thin barrier layer 153 is inserted between the linear polarization layer 151 and the phase delay layer 152, for preventing an influence on a surface of the linear polarization layer formed in advance when coating and forming film of the phase delay layer 152. The barrier layer 153 can be an organic layer with a thickness in a range of 1 μm-20 μm, such as TAC, polyimide (PI), and polyethylene terephthalate (PET), or an inorganic layer with a thinner thickness. In addition, when forming the linear polarization layer it is required to be fixed and oriented, so that, as shown in FIG. 9, the phase delay layer 152 is formed on the first base 150, and placed on the side of the first base 150 away from the array substrate 11, and the coated polarization layer further includes an orientation layer 154 placed between the linear polarization layer 151 and the phase delay layer 152, to realize fix and orientation for the liquid crystal layer when forming the linear polarization layer.

It should be noted that, the polarization functional layer of the embodiments of the present disclosure can be realized in other ways, but not limited to those three structures as shown in FIGS. 7-9. For example, the first base 150 is omitted, and the polarization functional layer is directly formed on the sealing film layer 13 or integrated into other functional layers of the flexible display panel of the embodiments of the present disclosure, such as integrated into a touch panel, for further reducing the thickness of the display panel and meeting highly flexible application requirements.

In addition, in the embodiments of the present disclosure, as shown in FIGS. 3 and 4, the flexible display panel 200 further includes the touch functional layer 16. The touch functional layer can be placed on one side of the polarization functional layer 15 away from the array substrate 11 as shown in FIG. 3, or can be placed on one side of the polarization functional layer 15 adjacent to the array substrate 11 as shown in FIG. 4. In the embodiments of the present disclosure, the touch functional layer can be laminated and adhered to other film layers by adhesion.

When adhering film layers of the flexible display panel, the flexible display panel further includes a pressure sensitive adhesive (Pressure Sensitive Adhesive, PSA) layer. The pressure sensitive adhesive layer is at least placed at a position most close to the display functional layer or the sealing film layer. For example, the PSA layer is placed between the polarization functional layer 15 and the sealing film layer 13, as shown in FIG. 3; or the PSA layer is placed between the touch functional layer 16 and the sealing film layer 13, as shown in FIG. 4. Performances of the PSA layer are similar with performances of OCA, while PSA is almost nonabsorbent, so that a problem of short lifetime of the flexible panel caused by an ability of water and oxygen proof of OCA adjacent to the light-emitting functional layer can be overcome.

Figure 5:
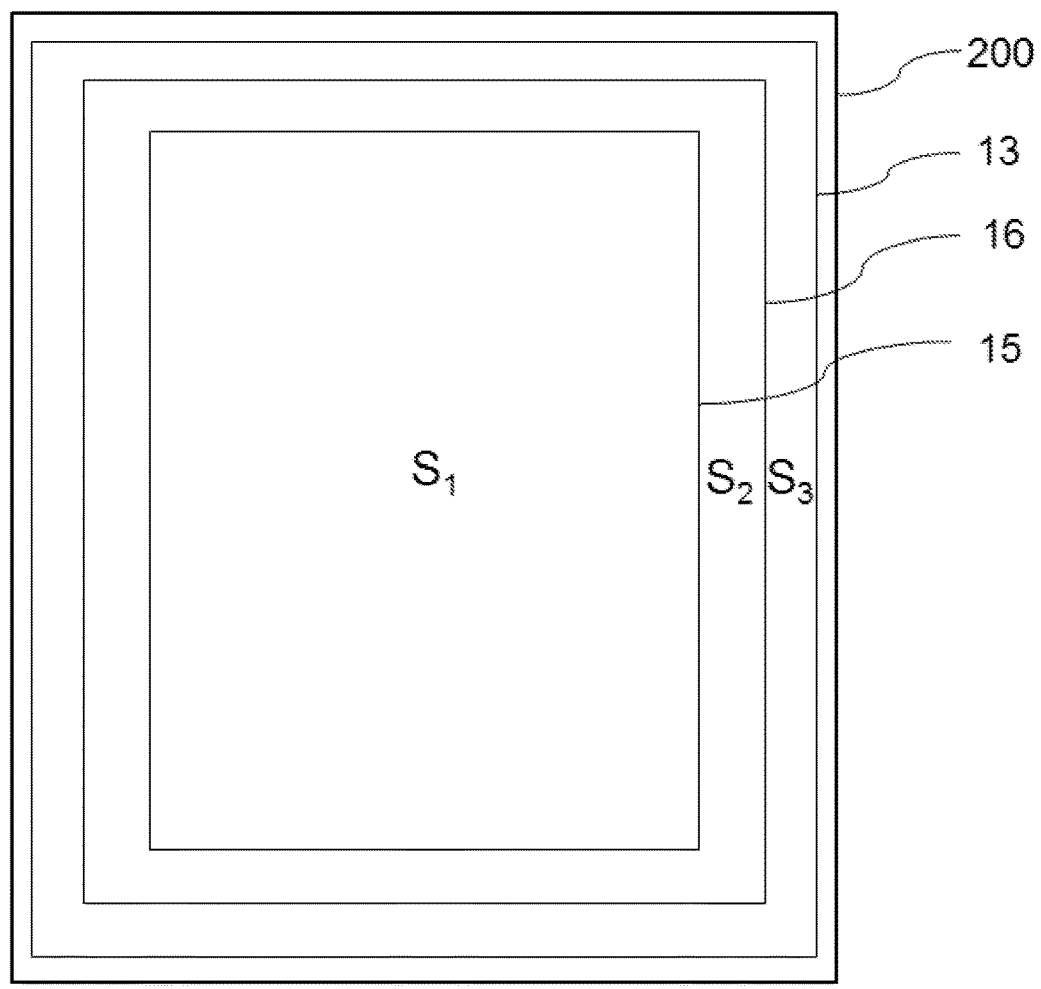
FIG. 5 illustrates a top view of the display device shown in FIG. 4.

It is found by the applicant after further research, for the flexible display panel of the embodiments of the present disclosure, in order to reach a preferable performance of flexible display and touch performance, areas of the polarization functional layer, the touch functional layer, and the sealing film layer are required to meet a certain relation. An inherent principle of the area relation among those layers is found after applicant's deep research and demonstration by practice. Referring to FIG. 5, take the display panel provided by the embodiments as shown in FIGS. 4 and 5 as an example, an area of the polarization functional layer 15 refers to $S_1$, an area of the touch functional layer 16 refers to $S_2$, an area of the sealing film layer 13 refers to $S_3$, and $S_1 < S_2 \leq S_3$ is met. The flexible panel meeting that condition can better block reflection of external ambient light, has a better touch sensitivity, and a frame of the display panel can be more narrow, which improves users' display and touch experience and prolongs the lifetime of the display panel; at the same time, a process for making a panel can be simplified at a great degree, a production cost is decreased, and a production efficiency is improved, which facilitates large-scale industrialization application of flexible displays. That find has great impetus and important influence for the commercial application of flexible display panels.

Figure 6:
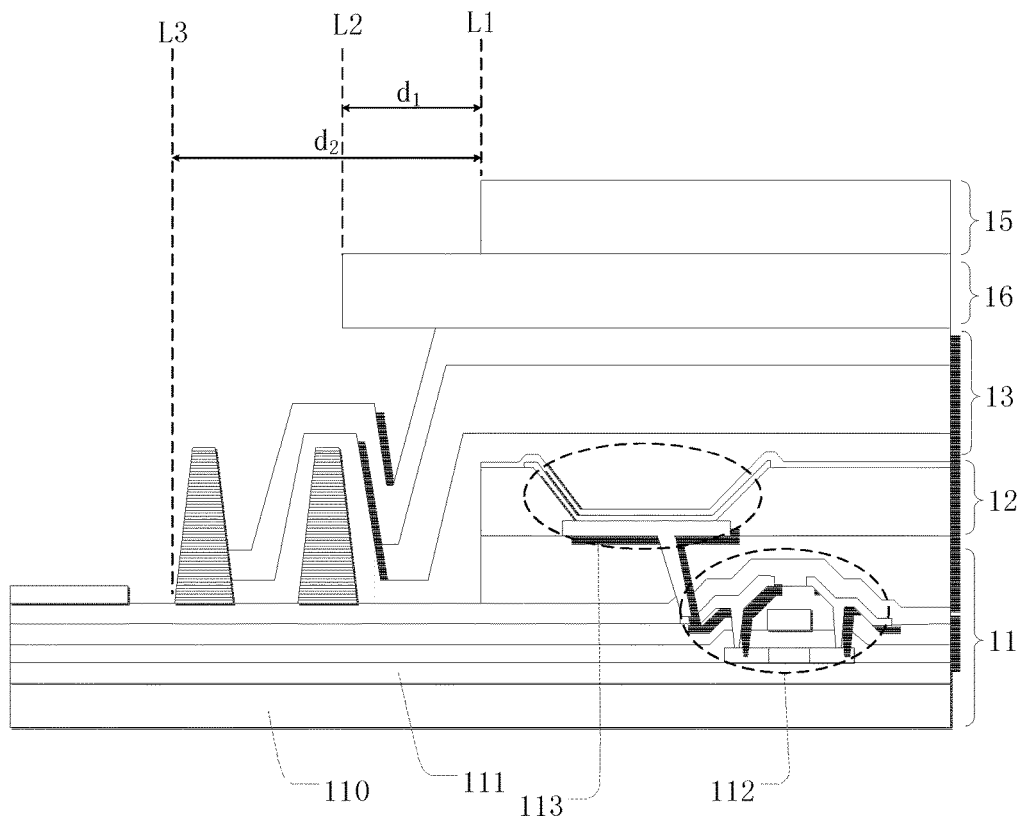
FIG. 6 illustrates an enlarged view of a dotted block portion of the display panel shown in FIG. 4.

Furthermore, please refer to FIG. 6, which illustrates an enlarged view of a dotted block portion of the display panel shown in FIG. 4, which takes the display panel as shown in FIG. 4 as an example. The flexible display panel 200 includes a flexible substrate 110. The flexible substrate 110 is made of any suitable flexible insulation materials. For example, the flexible substrate 110 can be made of polymer materials, such as polyimide (PI), Polycarbonate (PC), Polyethersulfone (PES), polyethylene terephthalate (PET), polyethylene naphthalate (PEN), Polyarylate (PAR), and fiberglass reinforced plastics (FRP). The flexible substrate 110 can be transparent, translucent, or non-transparent.

A buffer layer 111 is placed on the flexible substrate 110 and covers an entire top surface of the flexible substrate 110. In an embodiment, the buffer layer 111 includes an inorganic layer or an organic layer. For example, the buffer layer 111 can be made of material selected from inorganic materials, such as silicon oxide ($SiO_x$), silicon nitride ($SiN_x$), silicon oxynitride ($SiO_xN_y$), aluminum oxide ($AlO_x$), and aluminum nitride ($AlN_x$), or can be made of material selected from organic materials, such as acryl, polyimide (PI), and polyester. The buffer layer 111 can include a single layer or multiple layers. The buffer layer 111 blocks oxygen and moisture, prevents moisture or impurities from spreading by the flexible substrate 110, and provides a flat surface on the top surface of the flexible substrate 110.

In FIG. 6, the array substrate 11 is an active matrix active drive array substrate, and includes a plurality of thin film transistors 112 placed in array. The array substrate 11 can be an a-Si TFT array substrate, an LTPS array substrate, an oxide TFT array substrate, or an OFET array substrate, or a mixed TFT array substrate, which is not limited in the present disclosure. In addition, a drive mode of the flexible panel of the present disclosure can be a passive matrix active drive mode, which is not limited in the present disclosure.

The light-emitting functional layer 12 includes a plurality of OLED elements 113. Generally, the OLED member 113 includes a first electrode, a second electrode, and a light-emitting layer sandwiched between the first electrode and the second electrode. The light-emitting functional layer 12 generally further includes a pixel defining layer. An OLED pixel opening is defined in the pixel defining layer, for defining a pixel.

The first electrode is used as an anode and is made of conductive materials. For example, the first electrode can be formed as a transparent electrode or a reflection electrode according to its use.

When the first electrode is formed as the transparent electrode, the first electrode can include indium tin oxide (ITO), indium zinc oxide (IZO), zinc oxide (ZnO), or indium oxide ($In_2O_3$). When the first electrode is formed as the reflection electrode, a reflection layer can be made of Ag, Mg, Al, Pt, Pd, Au, Ni, Nd, Ir, Cr, or a mixture thereof, and ITO, IZO, ZnO, or $In_2O_3$ can be formed on the reflection layer.

The pixel defining layer (PDL) is placed on the planarization layer to cover a periphery of the first electrode. In an embodiment, PDL surrounding the periphery of the first electrode defines an emission area of each sub-pixel. PDL can be made of organic materials, such as PI, polyamide, benzocyclobutene (BCB), acrylic resin, and phenolic resin.

The light-emitting layer is placed on the first electrode, and a portion of the first electrode on which the light-emitting layer is placed is not covered by PDL but exposed. The light-emitting layer can be formed by a vapor deposition process. The light-emitting layer is patterned to correspond to each sub-pixel, that is to say, to correspond to the first electrode patterned.

The light-emitting layer can be made of organic materials of low molecular weight or of high molecular weight. The light-emitting layer includes an organic emission layer, and can further include at least one of a hole injection layer (Hole Injection Layer, HIL), a hole transmission layer (Hole Transmission Layer, HTL), an electron transmission layer (Electron Transmission Layer, ETL), and an electron injection layer (Electron Injection Layer, EIL). The light-emitting layer can include other various functional layers in addition to the organic emission layer.

The second electrode (used as a cathode of OLED) is placed on the light-emitting layer. Similar to the first electrode, the second electrode can be formed to be a transparent electrode or a reflection electrode.

The thin film sealing layer 13 generally includes at least one organic sealing layer and at least one inorganic sealing layer, and the at least one organic sealing layer and the at least one inorganic sealing layer are alternately stacked up.

A material of the inorganic sealing layer can include non-metal, metallic oxide, non-metallic oxide, a mixture of metallic oxide and non-metallic oxide; metallic fluoride, non-metallic fluoride, a mixture of metallic fluoride and non-metallic fluoride; metallic nitride, non-metallic nitride, a mixture of metallic nitride and non-metallic nitride; metallic carbide, non-metallic carbide, a mixture of metallic carbide and non-metallic carbide; metallic oxynitride, non-metallic oxynitride, a mixture of metallic oxynitride and non-metallic oxynitride; metallic boride, non-metallic boride, a mixture of metallic boride and non-metallic boride; metallic silicide, non-metallic silicide, a mixture of metallic silicide and non-metallic silicide; alloy of at least two kinds of metal; and alloy of metal and non-metal. For example, the inorganic sealing layer can include any one of $SiN_x$, $Al_2O_3$, $SiO_2$, and $TiO_2$. Since a layer structure of the inorganic sealing layer is relatively compact mainly to block water and oxygen, while a stress concentration may easily be caused and then crack is generated therein.

A material of the organic sealing layer can include polymer, such as a single layer or stacked layers made of PET, PM, PC, epoxy resin, PE, polyacrylate, and organo-siloxane. The organic sealing layer can buffer stress between the inorganic sealing layer, and increase water and oxygen spread path. In addition, the thin film sealing layer 13 further includes a bank on a border area of the display panel. Generally there are two banks, a first bank is adjacent to a display area for limiting a boundary of the organic thin film layer, and a second bank is used to block an extension of crack. In some implementing manners, the bank is prepared in a same process with the planarization layer, the pixel defining layer, and a support layer on the pixel defining layer.

For the flexible display panel of the embodiments of the present disclosure, it is found by applicant that, a certain position relation among a boundary of the an orthogonal projection of the touch functional layer on the array substrate, a boundary of the an orthogonal projection of the sealing film layer on the array substrate, and a boundary of the an orthogonal projection of the polarization functional layer on the array substrate should be satisfied to reach a preferable performance of flexible display and touch performance. An inherent principle of the area relation among those layers is found after applicant's deep research and demonstration by practice. An orthogonal projection of the polarization functional layer on the array substrate includes a first boundary $L_1$, an orthogonal projection of the touch functional layer 16 on the array substrate includes a second boundary $L_2$, an orthogonal projection of the sealing film layer 13 on the array substrate includes a third boundary $L_3$, a distance between the first boundary $L_1$ and the second boundary $L_2$ refers to $d_1$, a distance between the first boundary $L_1$ and the third boundary $L_3$ refers to $d_2$, 0.3 mm$\leq d_1 \leq$0.9 mm, $d_2 \leq$0.7 mm, and $d_2 \leq d_1$.

TABLE 1 comparison table of $d_1$, $d_2$, and performance of the display panel

| | $d_1$ | | | | | | | |
|---|---|---|---|---|---|---|---|---|
| | 0.1 | 0.2 | 0.3 | 0.5 | 0.7 | 0.9 | 1 | 1.5 |
| $d_2$ | | | | performance | | | | |
| 0.1 | poor | medium | excellent | excellent | excellent | excellent | medium | poor |
| 0.3 | poor | poor | excellent | excellent | excellent | excellent | medium | poor |
| 0.5 | poor | poor | poor | excellent | excellent | excellent | medium | poor |
| 0.7 | poor | poor | poor | poor | excellent | excellent | medium | poor |
| 0.9 | poor | poor | poor | poor | poor | medium | medium | poor |
| 1.5 | poor | poor | poor | poor | poor | poor | poor | poor |

Details refer to Table 1, a comparison table of $d_1$, $d_2$, and performance of the display panel are shown. A unit of d1 and $d_2$ is mm. The performance of the display panel is considered in four dimensions, such as display quality, consumer experience, reliability, and cost of manufacture, and is divided into three levels, "excellent", "medium", and "poor". As clearly shown in Table 1, when a condition of 0.3 mm$\leq d_1 \leq$0.9 mm, $d_2 \leq$0.7 mm, and $d_2 \leq d_1$ is satisfied, the performance of the display panel is excellent, and has a great advantage in aspects of display quality, consumer experience, reliability, and cost of manufacture. It is found by applicant's deep research, when each layer satisfies the above-mentioned position relation, the flexible display panel of the embodiment of the present disclosure can better block reflection of external ambient light, and has a better touch sensitivity, a frame of the display panel can be more narrow, which greatly improves users' display and touch experience and prolongs the lifetime of the display panel.

Figure 10:
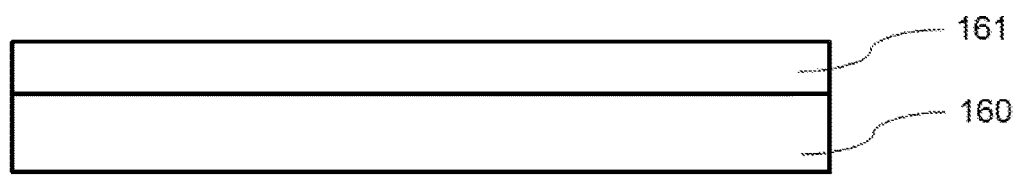
FIG. 10 illustrates a structural schematic diagram of a touch functional layer of a display device according to an embodiment of the present disclosure.
Figure 11:
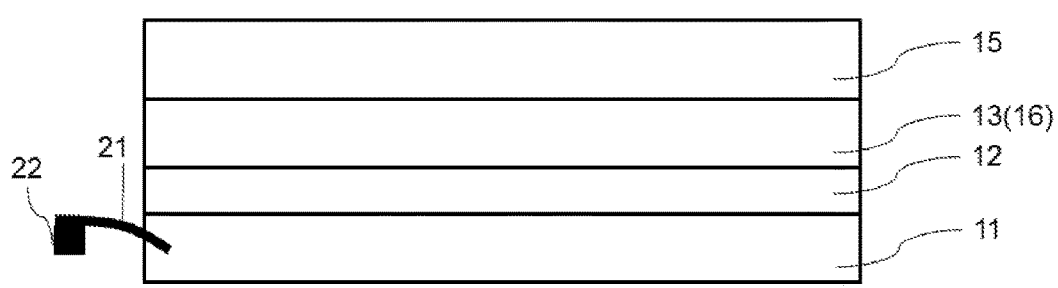
FIG. 11 illustrates a structural schematic diagram of a display device according to another embodiment of the present disclosure.

It should be understood by those skilled in the art that, in the above-described embodiments of the present disclosure, the touch functional layer is needed to be adhered to other layers of the flexible panel. The touch functional layer 16 should include a second base 160 and a touch electrode layer 161, as shown in FIG. 10. In other implementing manners of the present disclosure, the touch functional layer can also be as shown in FIG. 11, and includes a touch electrode layer directly formed on the sealing film layer 13, that is to say, the touch film layer is integrated in the thin film sealing layer of OLED panel. In such a design, the second base of the touch functional layer is omitted, and an adhesive layer used for adhering is also omitted, while the touch electrode layer is integrated in the thin film sealing layer, so that the flexible display panel obtained can have a thickness further reduced, which further meets an application requirement of high flexibility.

In the above-mentioned embodiments, a material of the second base 160 of the touch functional layer 16 can be polymers, such as TAC, cyclo olefin polymers (COP), PI, PC, PES, PET, PEN, PAR, and FRP, or other transparent or non-transparent materials with flexibility. It should be noted that, the touch functional layer is placed on one side of the polarization functional layer facing the array substrate, a material of the second base can include COP, which have excellent optical isotropic properties, when the second base is applied to the side of the polarization functional layer facing the array substrate, a situation that light after reflection in a process of passing through the polarization functional layer cannot be absorbed caused by an influence of an optical anisotropic material on a polarization phase of external light through the polarization functional layer is avoided. Thus, a block effect of the polarization functional layer to external light is not affected, and display quality of the flexible display panel is guaranteed.

The touch electrode layer of the present disclosure can include a plurality of touch electrodes arranged in array. Each touch electrode 31 is connected to a touch drive chip by a support conductive unit, for receiving a port of touch sensing signals, and the touch drive chip is used for outputting a port of touch scanning signals. When users touch, a capacitance of the touch electrode at a touch position changes, which makes signals of port of the touch electrode at the touch position change, and further makes the touch drive chip confirm a touch position by sensing signals received, and then make the display panel perform corresponding operation. A touch mode of the display panel of the present disclosure can be self-capacitance mode, mutual capacitance mode, or pressure sensitive touch mode, which is not limited in the present disclosure.

It should be further noted that, in embodiments of the present disclosure, there are various ways of connecting the flexible printed circuit (Flexible Printed Circuit, FPC) of a display functional module and a touch functional module to the drive chip, for example, the array substrate and the touch electrode layer are electrically connected to the drive chip by their respective FPC, the array substrate and the touch electrode layer are electrically connected to the drive chip by a same FPC, or other implementing manners, which is not limited in the present disclosure. As shown in FIGS. 3 and 4, the array substrate 11 of the display module is electrically connected to the display drive chip 20 by FPC 19, and the touch electrode layer 16 is electrically connected to the touch drive chip 18 by FPC 17. A process of such a solution is simple with efficiency, which is compatible with an existing equipment and process. Or, according to a manner shown in FIG. 11, the array substrate 11 and the touch electrode layer 16 are electrically connected with the drive chip 22 integrated with display function and touch function by only one same FPC 21, which drives the display module and the touch module at the same time only by one drive IC and one FPC. Therefore, an integration level is high, which decreases quantity of IC and quantity of FPC, and decreases a production cost. In addition, film layers in the panel is highly integrated, which is good for thin-type design of the display panel.

Figure 12:
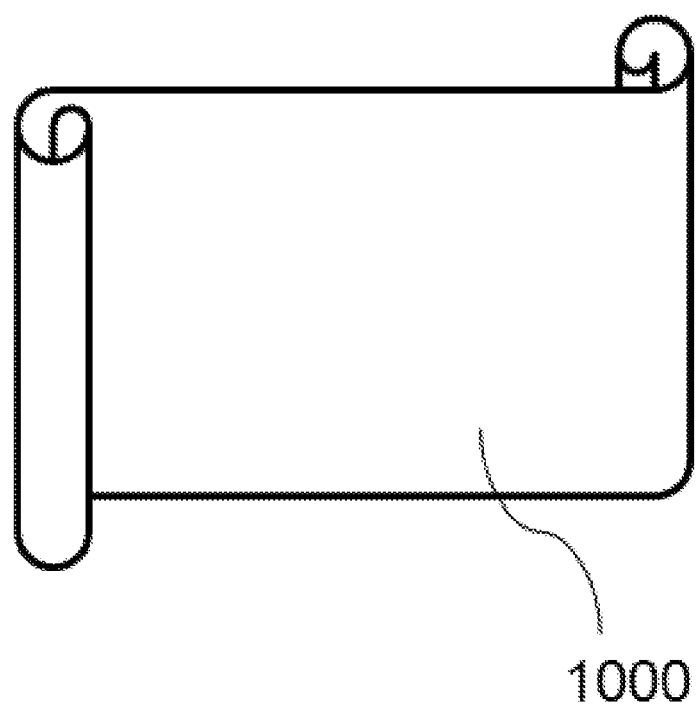
FIG. 12 illustrates a schematic diagram of an electronic device according to an embodiment of the present disclosure.

Based on the flexible display panel of any one embodiment as above-described, as shown in FIG. 12, the embodiments of the present disclosure further provides an electronic device 1000, including the display panel of any one embodiment of the present disclosure. The display panel of any one embodiment of the present disclosure can be various kinds of flexible display panel, such as OLED panel, micro LED panel, and QLED panel, which is not limited in the present disclosure. The corresponding electronic device 1000 can be any flexible, foldable, and curved product or member with a display function, such as television, desktop display, laptop computer, tablet computer, electrophoretic display, vehicle display, digital photo frame, navigator, industrial control display, cellphone, digital camera, watch, wristband, smart glasses, and electronic paper. The above terminal display devices are included but not limited to.

Figure 13:
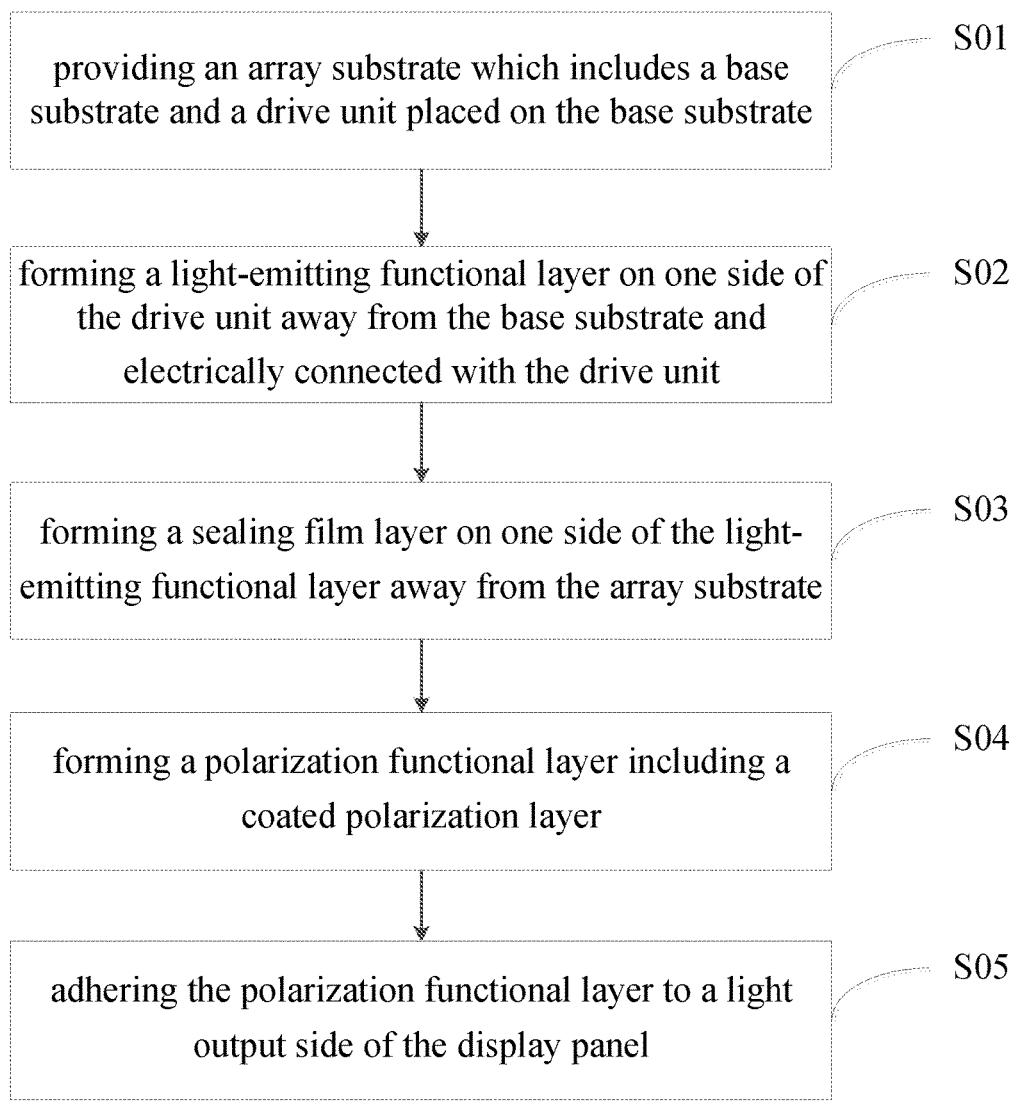
FIG. 13 illustrates a flow chart of a method for making a display panel according to an embodiment of the present disclosure.

Based on the flexible display panel of any one embodiment as above-described, a third aspect of the present disclosure further provides a method for making a display panel, as shown in FIG. 13, which illustrates a flow chart of a method for making a display panel according to an embodiment of the present disclosure. The method for making a display panel of the present disclosure includes:

S01: providing an array substrate which includes a base substrate and a drive unit placed on the base substrate;

The base substrate can be a flexible base, which can be made of any appropriate flexible insulation materials, such as PI, PC, PES, PET, PEN, PAR, FRP, and other polymers. The flexible base can be transparent, translucent, or non-transparent.

The drive unit can be a drive circuit providing a switch control function for the light-emitting functional layer of the display panel. The array substrate can be a-Si TFT array substrate, LTPS array substrate, oxide TFT array substrate, OFET array substrate, or mixed TFT array substrate, which is not limited in the present disclosure. In addition, a drive manner of the flexible panel of the present disclosure can be a passive matrix active drive, which is not limited in the present disclosure.

S02: forming a light-emitting functional layer on one side of the drive unit away from the base substrate and electrically connected with the drive unit.

The light-emitting functional layer can be one or any combination of a micro light-emitting diode (micro LED, or μLED), an organic light-emitting diode (OLED) layer, and a quantum light-emitting diode (QLED), which is not limited in the present disclosure. The drive manner of the flexible panel of the present disclosure can be an active matrix active drive or a passive matrix active drive, which is not limited in the present disclosure.

S03: forming a sealing film layer on one side of the light-emitting functional layer away from the array substrate.

The sealing film layer is used for sealing the light-emitting functional layer of the display panel for protection. When the light-emitting functional layer is the micro LED, the sealing film layer can be a planarization layer, and is used for playing functions of planarization and protection for a display diode layer and buffering an external impact force and a pollution of external impurities. When the light-emitting functional layer is the OLED, the sealing film layer can be a thin film sealing layer of an OLED panel, and is used for sealing an OLED layer and blocking water and oxygen. When the light-emitting functional layer is QLED, the sealing film layer can be a protection film layer. Those are not limited in the present disclosure. The light-emitting functional layer of the present disclosure can be other kinds of functional layers capable of realizing flexible display, but not limited those above-described.

S04: forming a polarization functional layer including a coated polarization layer.

In the method for making a display panel of the present disclosure, the polarization functional layer is placed on the light output side of the display panel, which is not limited in the present disclosure. The display panel can be a top emission structure, a bottom emission structure, or a double-side display. For a display panel in the top emission structure, the polarization functional layer is placed on one side of the light-emitting functional layer away from the array substrate; for a display panel in the bottom emission structure, the polarization functional layer is placed on one side of the array substrate away from the light-emitting functional layer; and for a display panel in the double-side display structure, there can be one or more polarization functional layer, which can be placed on a same side of the display panel or on different sides respectively. In addition, in the double-side display structure, the polarization functional layer can be omitted, and details depend on an actual situation.

In the method for making a display panel of the present disclosure, the coated polarization layer can be a film layer formed by coating liquid crystal and curing after orientation. The coated polarization layer can be made of other materials, which are not limited in the present disclosure. Specifically, when the coated polarization layer includes a linear polarization layer and a phase delay layer, both the linear polarization layer and the phase delay layer can be layers formed by coating liquid crystal material. A position relation between the coated polarization layer and a first base can be: the linear polarization layer and the phase delay layer are placed on one side of the first base facing the array substrate. In addition, the position relation between the coated polarization layer and the first base can be: the linear polarization layer and the phase delay layer are placed on one side of the first base away from the array substrate. No matter in which placement, the phase delay layer is placed on one side of the linear polarization layer close to the light-emitting functional layer, so as to guarantee that a cooperation of the linear polarization layer and the phase delay layer can effectively block reflection of the external ambient light.

Figure 14:
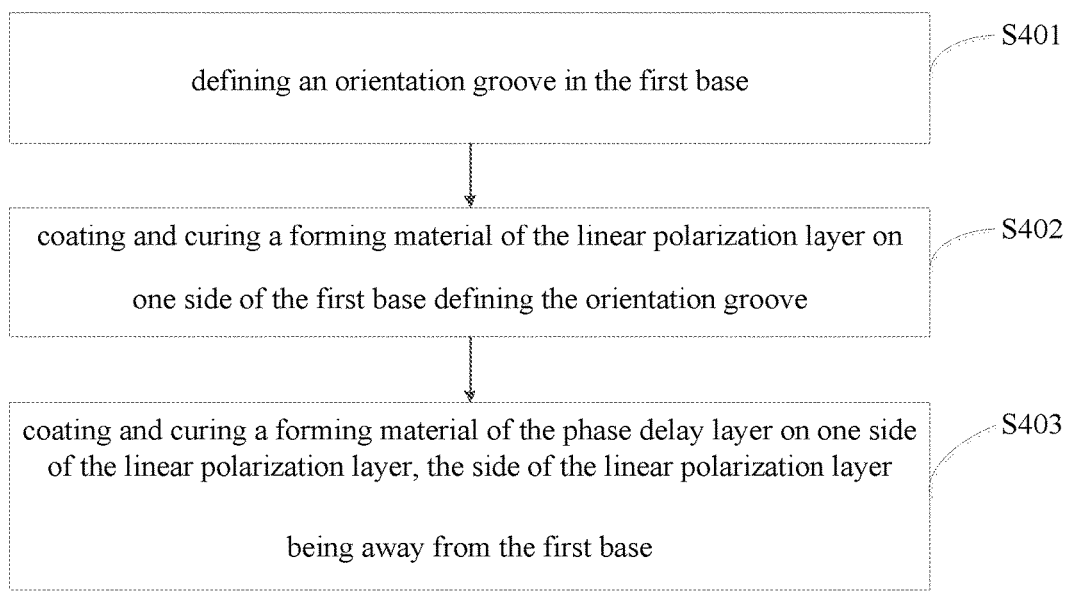
FIG. 14 illustrates a flow chart of an implementing manner of Step S04 in FIG. 13.

In one implementing manner of the method for making a display panel of the embodiments of the present disclosure, the coated polarization layer can include a linear polarization layer and a phase delay layer. The polarization functional layer further includes a first base. A method for preparing the polarization functional layer can be as shown in FIG. 14, specifically includes:

S401: defining an orientation groove in the first base.

A composition material of the first base can include polymers, such as TAC, COP, PI, PC, PES, PET, PEN, PAR, and FRP, or other flexible transparent materials. A method for defining the orientation groove can be a rolling process, a rubbing-brushing process, an etching process, or a carving process, which is not limited in the present disclosure.

S402: coating and curing a forming material of the linear polarization layer on one side of the first base defining the orientation groove. In the method for making a display panel of the present disclosure, the linear polarization layer is coated on the first base using a coated material. In an implementing manner, after a liquid crystal material is coated on the first base, by orientation and curing, the linear polarization layer is obtained. A coating manner can be coating, printing, inkjet printing, or spinning, which is not limited in the present disclosure. In an implementing manner, the linear polarization layer can be cured by UV light, and a function of photo-alignment is achieved, so that a better orientation effect is obtained.

S403: coating and curing a forming material of the phase delay layer on one side of the linear polarization layer, the side of the linear polarization layer being away from the first base. In an implementing manner of the method for making a display panel of the embodiments of the present, the forming material of the phase delay layer can also be liquid crystal material. Specifically, the liquid crystal material is coated on one side of the first base formed in S402 with the linear polarization layer, and then is cured. A coating manner can be coating, printing, inkjet printing, or spinning, which is not limited in the present disclosure. In an implementing manner, the phase delay layer can be cured thermally or by UV light, which is not limited in the present disclosure.

It should be noted that, in other embodiments of the present disclosure, after step of S402, a thin barrier layer can be prepared on one side of the linear polarization layer away from the first base, and then step of S403 is next performed. The barrier layer can be an organic layer with a thickness in a range of 1 μm-20 μm, such as TAC, PI, and PET, or an inorganic layer with a thinner thickness. In addition, if the linear polarization layer and the phase delay layer are placed on the side of the first base away from the array substrate, the phase delay layer is prepared on the first base first, and then the linear polarization layer is prepared. When forming the linear polarization layer, the linear polarization layer is required to be fixed and oriented, so that, in an implementing manner of the embodiments of the present disclosure, before preparation of the phase delay layer and the linear polarization layer, a step of preparing an orientation layer is included, to fix and orientate a liquid crystal layer when forming the linear polarization layer.

S05: adhering the polarization functional layer to a light output side of the display panel.

It should be noted that, the polarization functional layer of the embodiments of the present disclosure can be realized in other manners, but is not limited to structures as above-described. For example, the first base is omitted, the polarization film layer is formed directly on the sealing film layer or integrated with other functional layers of the flexible display panel of the embodiments of the present disclosure, such as integrated with a touch panel, for further reducing the thickness of the display panel, and satisfying the application requirement of high flexibility.

It should be noted that in some implementing manners of the embodiments of the present disclosure, the display panel further includes a touch functional layer. The touch functional layer can be integrated in the display panel by an add-on adhering manner. The touch functional layer can be placed on one side of the polarization functional layer facing the array substrate, or can be placed on one side of the polarization functional layer away from the array substrate. The touch functional layer needs to include a second base and a touch electrode layer, so as to be adhered to other film layers of the flexible panel. In other implementing manners of the embodiments of the present disclosure, the touch functional layer can include a touch electrode layer. The touch electrode layer is directly formed on the sealing film layer, and that is to say, the touch film layer is integrated in the thin film sealing layer of OLED panel.

When the touch functional layer is integrated in the display panel by an add-on adhering manner, a method for making a display panel of the embodiments of the present disclosure further includes:

Providing a touch functional layer, and laminating and adhering the touch functional layer, the polarization functional layer, and the array substrate having the light-emitting functional layer. The touch functional layer includes a second base and a touch electrode layer. An area of the polarization functional layer refers to $S_1$, an area of the touch functional layer refers to $S_2$, an area of the sealing film layer refers to $S_3$, and $S_1 < S_2 \leq S_3$. It should be noted that, when adhering film layers of the flexible display panel, the flexible display panel further includes a pressure sensitive adhesive (PSA) layer. The pressure sensitive adhesive layer is at least placed at a position most close to the display functional layer or the sealing film layer. For example, the PSA layer is placed between the polarization functional layer and the sealing film layer; or the PSA layer is placed between the touch functional layer and the sealing film layer. Performances of the PSA layer are similar with performances of OCA, while PSA is almost nonabsorbent, so that a problem of that the lifetime of the flexible panel is short caused by an ability of water and oxygen proof of OCA adjacent to the light-emitting functional layer can be overcome.

When the touch film layer is integrated in the thin film sealing layer of OLED panel, then after forming the sealing film layer and before forming the polarization functional layer, the method for making a display panel of the embodiments of the present disclosure can further include: forming the touch electrode layer directly on the sealing film layer. An area of the polarization functional layer refers to $S_1$, an area of the touch functional layer refers to $S_2$, an area of the sealing film layer refers to $S_3$, and $S_1 < S_2 \leq S_3$. The second base and an adhesive layer for adhering are omitted in such a manner, so that the thickness of the flexible display panel can be further reduced, and the disclosure requirement of high flexibility is further satisfied.

It is found by applicant's long-term deep research that, for the flexible display panel of the embodiments of the present disclosure, no matter the touch functional layer is formed by add-on adhering or the touch functional layer is integrated in the sealing film layer, a relation among the area of the polarization functional layer $S_1$, the area of the touch functional layer $S_2$, and the area of the sealing film layer meets that $S_1 < S_2 \leq S_3$. The flexible panel meeting that condition can better block reflection of external ambient light, and has a better touch sensitivity, and a frame of the display panel can be more narrow, which greatly improves users' display and touch experience and prolongs the lifetime of the display panel; at the same time a process for making a panel can be simplified at a great degree, a production cost is decreased, and a production efficiency is improved, which facilitates large-scale industrialization application of flexible displays. Such a find has great impetus and important influence for the commercial application of flexible display panels.

In addition, in implementing manner of the embodiments of the present disclosure, an orthogonal projection of the polarization functional layer on the array substrate includes a first boundary $L_1$, an orthogonal projection of the touch functional layer on the array substrate includes a second boundary $L_2$, an orthogonal projection of the sealing film layer on the array substrate includes a third boundary $L_3$, a distance between the first boundary $L_1$ and the second boundary $L_2$ refers to $d_1$, and a distance between the first boundary $L_1$ and the third boundary $L_3$ refers to $d_2$. It is found by applicant's research that, for the flexible display panel of the embodiments of the present disclosure, no matter the touch functional layer is formed by add-on adhering or the touch functional layer is integrated in the sealing film layer, it is met that $0.3 \text{ mm} \leq d_1 \leq 0.9 \text{ mm}$, $d_2 \leq 0.7 \text{ mm}$, and $d_2 \leq d_1$. The flexible panel meeting that condition can better block reflection of external ambient light, and has a better touch sensitivity, and the frame of the display panel can be more narrow, which greatly improves users' display and touch experience and prolongs the lifetime of the display panel It should be noted that the details and beneficial effects of the description of each structure in the aforementioned embodiments of the present disclosure are applicable to the embodiments herein, which will not be repeated herein.

The present disclosure provides the display panel, the electronic device including the display panel, and the method for making the display panel. The display panel includes an array substrate, the array substrate including a base substrate and a drive unit placed on the base substrate; a light-emitting functional layer placed on one side of the drive unit away from the base substrate, the light-emitting functional layer being electrically connected with the drive unit; a sealing film layer placed on one side of the light-emitting functional layer away from the array substrate; and a polarization functional layer placed on a light output side of the display panel; wherein the polarization functional layer includes a coated polarization layer. Compared with the prior art, the display panel of the present disclosure includes less film layers, and layers of the display panel are thinner, which facilitates the thin-type design of the flexible display panel, greatly improves a bending property of the display panel, and prevents the display panel from the phenomenon of light leakage when being flexibly bended. In addition, the method for making a display panel of the present disclosure is simple, a production cost is low, and a production efficiency is high, which is good for a large-scale production application.

Above content is to combine preferred embodiments further description made for the present disclosure, it is impossible that the specific implementation of the present disclosure is limited to those explanations. For person of an ordinary skill in the art of the present disclosure, without departing from the inventive concept of the premise, some simple deduction or replace can also be made, which shall fall within the scope of the present disclosure.

What is claimed is:

1. A display panel, comprising:
   an array substrate comprising a base substrate and a drive unit placed on the base substrate;
   a light-emitting functional layer placed on one side of the drive unit away from the base substrate and electrically connected with the drive unit;
   a sealing film layer placed on one side of the light-emitting functional layer away from the array substrate;
   a polarization functional layer placed on a light output side of the display panel; and
   a touch functional layer,
   wherein the polarization functional layer comprises a coated polarization layer,
   an area of the polarization functional layer is $S_1$, an area of the touch functional layer is $S_2$, an area of the sealing film layer is $S_3$, and $S_1 < S_2 \leq S_3$, and
   an orthogonal projection of the polarization functional layer on the array substrate comprises a first boundary, an orthogonal projection of the touch functional layer on the array substrate comprises a second boundary, an orthogonal projection of the sealing film layer on the array substrate comprises a third boundary, a distance between the first boundary and the second boundary is $d_1$, a distance between the first boundary and the third boundary is $d_2$, 0.3 mm $\leq d_1 \leq$ 0.9 mm, $d_2 \leq$ 0.7 mm, and $d_2 \leq d_1$.

2. The display panel according to claim 1, wherein the light-emitting functional layer is a micro light-emitting diode layer or an organic light-emitting diode layer.

3. The display panel according to claim 1, wherein the polarization functional layer is placed on one side of the sealing film layer away from the array substrate, the polarization functional layer further comprises a first base, and the coated polarization layer is formed on the first base.

4. The display panel according to claim 3, further comprising a pressure sensitive adhesive layer placed between the polarization functional layer and the sealing film layer.

5. The display panel according to claim 1, wherein the coated polarization layer comprises a linear polarization layer and a phase delay layer.

6. The display panel according to claim 5, wherein the coated polarization layer further comprises an orientation layer placed between the linear polarization layer and the phase delay layer.

7. The display panel according to claim 1, wherein the touch functional layer comprises a second base and a touch electrode layer, the touch functional layer is placed on one side of the polarization functional layer facing the array substrate, and a material of the second base comprises cycloolefin polymer.

8. The display panel according to claim 1, wherein the touch functional layer comprises a touch electrode layer, and the touch electrode layer is formed directly on the sealing film layer.

9. The display panel according to claim 1, wherein the array substrate is electrically connected to a drive chip by a flexible printed circuit, and the touch electrode layer is electrically connected to the drive chip by another flexible printed circuit; or the array substrate and the touch electrode layer are electrically connected to a drive chip by a same flexible printed circuit.

10. An electronic device, comprising a display panel, wherein the display panel comprises:
    an array substrate comprising a base substrate and a drive unit placed on the base substrate;
    a light-emitting functional layer placed on one side of the drive unit away from the base substrate and electrically connected with the drive unit;
    a sealing film layer placed on one side of the light-emitting functional layer away from the array substrate;
    a polarization functional layer placed on a light output side of the display panel; and
    a touch functional layer,
    wherein the polarization functional layer comprises a coated polarization layer,
    an area of the polarization functional layer is $S_1$, an area of the touch functional layer is $S_2$, an area of the sealing film layer is $S_3$, and $S_1 < S_2 \leq S_3$, and
    an orthogonal projection of the polarization functional layer on the array substrate comprises a first boundary, an orthogonal projection of the touch functional layer on the array substrate comprises a second boundary, an orthogonal projection of the sealing film layer on the array substrate comprises a third boundary, a distance between the first boundary and the second boundary is $d_1$, a distance between the first boundary and the third boundary is $d_2$, 0.3 mm $\leq d_1 \leq$ 0.9 mm, $d_2 \leq$ 0.7 mm, and $d_2 \leq d_1$.

11. A method for making a display panel, comprising steps of:
    providing an array substrate, the array substrate comprising a base substrate and a drive unit placed on the base substrate;
    forming a light-emitting functional layer, the light-emitting functional layer being placed on one side of the drive unit away from the base substrate, the light-emitting functional layer being electrically connected with the drive unit;

forming a sealing film layer, the sealing film layer being placed on one side of the light-emitting functional layer away from the array substrate;

forming a polarization functional layer, the polarization functional layer comprising a coated polarization layer; and adhering the polarization functional layer on a light output side of the display panel, wherein the display panel further comprises a touch functional layer, an area of the polarization functional layer is $S_1$, an area of the touch functional layer is $S_2$, an area of the sealing film layer is $S_3$, and $S_1<S_2 \leq S_3$, and an orthogonal projection of the polarization functional layer on the array substrate comprises a first boundary, an orthogonal projection of the touch functional layer on the array substrate comprises a second boundary, an orthogonal projection of the sealing film layer on the array substrate comprises a third boundary, a distance between the first boundary and the second boundary is $d_1$, a distance between the first boundary and the third boundary is $d_2$, 0.3 mm$\leq d_1 \leq$0.9 mm, $d_2 \leq$0.7 mm, and $d_2 \leq d_1$.

12. The method for making a display panel according to claim 11, wherein the coated polarization layer comprises a linear polarization layer and a phase delay layer, the polarization functional layer further comprises a first base, wherein the step of forming the polarization functional layer comprises:

defining an orientation groove in the first base;

coating and curing a forming material of the linear polarization layer on one side of the first base, the orientation groove being defined in the side of the first base; and coating and curing a forming material of the phase delay layer on one side of the linear polarization layer, the side of the linear polarization layer being away from the first base.

13. The method for making a display panel according to claim 11, further comprising steps of:

providing the touch functional layer; and laminating and adhering the touch functional layer, the polarization functional layer, and the array substrate having the light-emitting functional layer;

wherein the touch functional layer comprises a second base and a touch electrode layer.

14. The method for making a display panel according to claim 11, wherein the touch functional layer comprises a touch electrode layer, after the step of forming the sealing film layer and before the step of forming the polarization functional layer, the method for making a display panel further comprises:

forming the touch electrode layer directly on the sealing film layer.

* * * * *